(12) United States Patent
Hung et al.

(10) Patent No.: US 9,773,842 B2
(45) Date of Patent: Sep. 26, 2017

(54) MEMORY DEVICES

(71) Applicant: Winbond Electronics Corp., Taichung (TW)

(72) Inventors: Tso-Hua Hung, Taichung (TW); Kao-Tsair Tsai, Taichung (TW); Hsaio-Yu Lin, Hsinchu County (TW); Bo-Lun Wu, Changhua County (TW); Ting-Ying Shen, Chiayi (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/230,837

(22) Filed: Aug. 8, 2016

(65) Prior Publication Data

US 2017/0186814 A1    Jun. 29, 2017

(30) Foreign Application Priority Data

Dec. 23, 2015  (TW) .............................. 104143321 A

(51) Int. Cl.
| | | |
|---|---|---|
| *H01L 47/00* | (2006.01) | |
| *H01L 27/24* | (2006.01) | |
| *H01L 45/00* | (2006.01) | |

(52) U.S. Cl.
CPC ...... *H01L 27/2463* (2013.01); *H01L 45/1233* (2013.01); *H01L 45/1253* (2013.01); *H01L 45/146* (2013.01); *H01L 45/1608* (2013.01)

(58) Field of Classification Search
USPC ............... 257/4, 68–71, 295–309, 905–908, 257/E27.084–E27.097, E27.075, 314–326, 257/E27.078, E29.3–E29.309, 255–266, 257/E21.179–E21.182, E21.209–E21.21, 257/E21.422, E21.423, E21.679–E21.694, 257/421, 5, 751, 330, E21.584, 8; 438/3, 438/104, 98, 382
See application file for complete search history.

(56) References Cited

U.S. PATENT DOCUMENTS

| | | |
|---|---|---|
| 7,829,923 B2 | 11/2010 | Li et al. |
| 8,178,388 B2 | 5/2012 | Ho |
| 8,963,114 B2 | 2/2015 | Liao et al. |
| 9,023,699 B2 | 5/2015 | Chang et al. |

(Continued)

FOREIGN PATENT DOCUMENTS

| | | |
|---|---|---|
| TW | 201513180 A | 4/2015 |
| WO | WO 2013057920 A1 | 4/2013 |

OTHER PUBLICATIONS

An Office Action from corresponding TW Application No. 104143321 dated Mar. 16, 2017; 5 pgs.

*Primary Examiner* — Tram H Nguyen
(74) *Attorney, Agent, or Firm* — Muncy, Geissler, Olds & Lowe, P.C.

(57) ABSTRACT

Memory devices are provided. The memory device includes a substrate. A dielectric layer is disposed on the substrate and a plurality of resistive memory cells is disposed on the dielectric layer. Each resistive memory cell includes a via disposed in a first opening of the dielectric layer. A conductive layer is disposed on the via. The memory device further includes a capacitor structure including a bottom electrode, a variable resistance layer disposed on the bottom electrode and a top electrode disposed on the variable resistance layer, wherein the bottom electrode is disposed on the conductive layer.

20 Claims, 17 Drawing Sheets

(56) References Cited

U.S. PATENT DOCUMENTS

| | | | |
|---|---|---|---|
| 2005/0036361 A1* | 2/2005 | Fukuzumi | H01L 27/228 365/158 |
| 2006/0038221 A1* | 2/2006 | Lee | B82Y 10/00 257/315 |
| 2013/0064001 A1* | 3/2013 | Terai | H01L 45/04 365/148 |
| 2013/0214236 A1 | 8/2013 | Lu et al. | |
| 2015/0052302 A1* | 2/2015 | Dong | H01L 43/08 711/118 |
| 2016/0225979 A1* | 8/2016 | Hsu | H01L 43/08 |

* cited by examiner

MEMORY DEVICES

CROSS REFERENCE TO RELATED APPLICATIONS

This Application claims priority of Taiwan Patent Application No. 104143321, filed on Dec. 23, 2015, the entirety of which is incorporated by reference herein.

BACKGROUND OF THE INVENTION

Field of the Invention

The present invention relates to memory devices, and in particular to a resistive memory device with a capacitor structure formed on a flat conductive layer.

Description of the Related Art

It has been found that reductions in the size of flash memory devices do not come without the limitations imposed by increased costs. Designers have been looking to the next generation of nonvolatile memory devices such as resistive random access memory (RRAM) to improve write speeds and reduce power consumption. The structure of RRAM is simple, and RRAM has a simple staggered array and can be produced at low temperatures. RRAM therefore has the potential to replace the flash memory as presented. However, RRAM has the problem of leakage, and it is a challenge to solve the RRAM's leakage problem.

BRIEF SUMMARY OF THE INVENTION

The disclosure provides a memory device. The memory device includes a substrate. The memory device also includes a dielectric layer disposed on the substrate, and a plurality of resistive memory cells disposed on the dielectric layer, wherein every resistive memory cell includes: a via disposed in a first opening of the dielectric layer. The resistive memory cell also includes a conductive layer disposed on the via, and a capacitor structure including a bottom electrode, a variable resistance layer disposed on the bottom electrode and a top electrode disposed on the variable resistance layer, wherein the bottom electrode is disposed on the conductive layer.

The disclosure provides a method for forming a memory device. The method includes providing a substrate. The method includes forming a first dielectric layer over the substrate. The method includes forming a first opening in the first dielectric layer, and forming a via in the first opening; forming a second dielectric layer over the first dielectric layer. The method also includes forming a second opening in the second dielectric layer, and filling a conductive layer in the second opening, wherein the aspect ratio of the second opening is smaller than the aspect ratio of the first opening. The method further includes performing a planarization process on the conductive layer, and forming a capacitor structure over the conductive layer, wherein the bottom electrode of the capacitor structure is in contact with a planarized surface of the conductive layer.

The disclosure provides a method for forming a memory device. The method includes providing a substrate. The method includes forming a dielectric layer over the substrate. The method also includes forming a via in the dielectric layer. The method further includes forming a conductive layer over the via and the dielectric layer, and forming a capacitor structure over the conductive layer, wherein the capacitor structure includes a bottom electrode formed over the conductive layer, a variable resistance layer formed over the bottom electrode and a top electrode formed over the variable resistance layer.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following disclosure provides many different embodiments, or examples, for implementing different features of the provided subject matter. Specific examples of components and arrangements are described below to simplify the present disclosure. It will be apparent, however, that the exemplary embodiments set forth herein are used merely for the purpose of illustration, and the inventive concept may be embodied in various forms without being limited to those exemplary embodiments. Some embodiments of the disclosure are described. FIGS. 1A-1J are cross-sectional views of various stages of a process for forming a memory device, in accordance with some embodiments. Additional operations can be provided before, during, and/or after the stages described in FIGS. 1A-1J. Some of the stages that are described can be replaced or eliminated for different embodiments. Additional features can be added to the memory device. Some of the features described below can be replaced or eliminated for different embodiments.

Figure 1A:
FIGS. 1A to 1J are cross-sectional representations of various stages of forming a resistive memory cell of a memory device in accordance with some embodiments.

As shown in FIG. 1A, a semiconductor substrate 101 is provided. In some embodiments, the semiconductor substrate 101 includes semiconductor wafer, isolation feature, source/drain, gate, contact and other features (not shown).

Figure 1B:
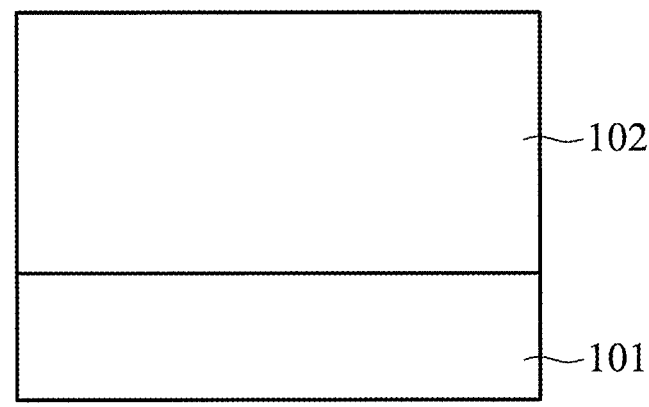

As shown in FIG. 1B, a first dielectric layer 102 is deposited over the semiconductor substrate 101. The first dielectric layer 102 is formed by dielectric material. The dielectric material may include silicon oxide, silicon nitride, silicon oxynitride, fluoride-doped silicate glass (FSG), low-K dielectric material, another suitable material, or a combination thereof. In some embodiments, the first dielectric layer 102 may be formed by chemical vapor deposition (CVD) process.

Figure 1C:
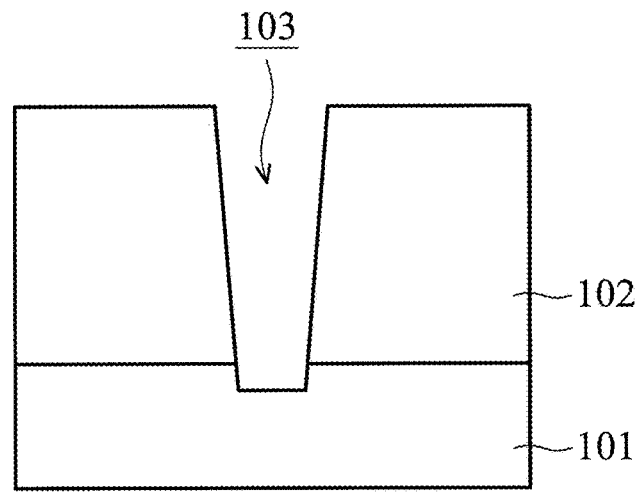

In some embodiments, as shown in FIG. 1C, a first opening 103 is formed in the first dielectric layer 102 after the first dielectric layer 102 is deposited. The first opening 103 passes through the first dielectric layer 102, and extends further to the semiconductor substrate 101. The first opening 103 may be formed by preforming an etching process on the first dielectric layer 102. The etching processes include dry etching, wet etching, or other etching methods. The etching process is also either purely chemical etching (plasma etching), purely physical etching, or a combination thereof.

Figure 1D:
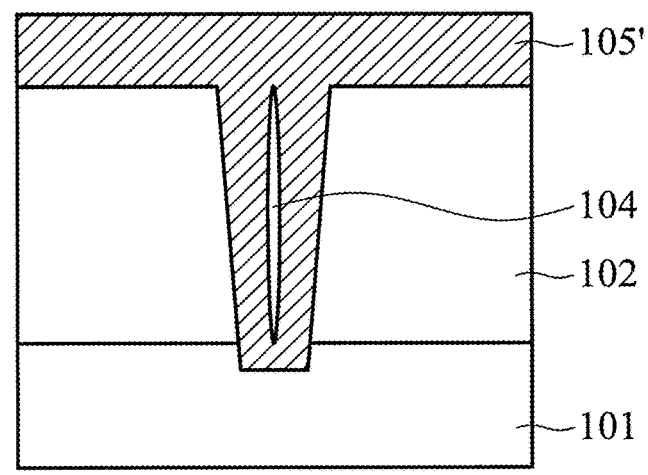
Figure 1E:
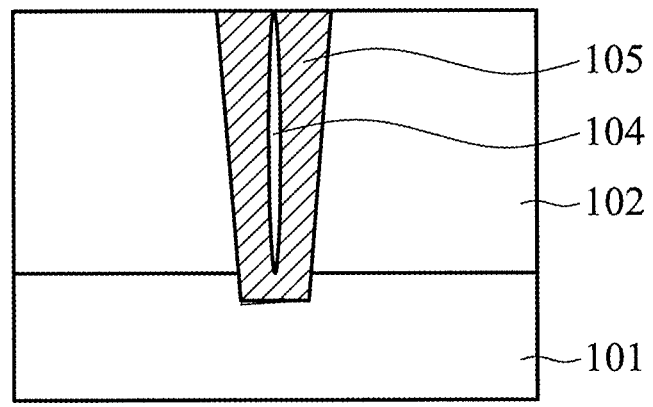

As shown in FIG. 1D, a conductive material layer 105' is deposited in the first opening 103 and over the first dielectric layer 102. The conductive material layer 105' includes metal, for example, tungsten, copper, or another applicable conductive material. The conductive material layer 105' may be formed by chemical vapor deposition (CVD), physical vapor deposition (PVD), or another applicable process. As shown in FIG. 1E, to remove excess material of the conductive material layer 105' beyond the first opening 103, a grinding or a chemical mechanical polishing (CMP) process may be utilized whereby etchants and abrasives are utilized in order to remove the excess material of the conductive material layer 105', and the conductive material layer 105' remaining within the first opening 103 forms a via 105. The via 105 is electrically connected to the metal layer or other conductive elements (not shown) within the semiconductor substrate 101.

It should be noted that because the first opening 103 has a larger aspect ratio such as 2-7, a seam 104 is usually fat tied in the first opening 103 during the deposition of the conductive material layer 105'. In addition, the seam 104 may be exposed in the surface of the via 105 after the chemical mechanical polishing process is performed on the conductive material layer 105'. If a capacitor structure is formed on the via 105 directly, then a bottom electrode of the subsequently formed capacitor structure will be in contact with the seam 104, and thus leakage may occur in the memory device.

Figure 1F:
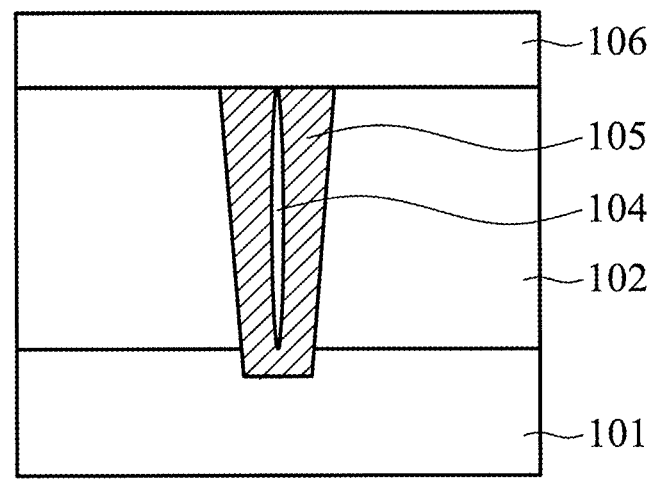
Figure 1G:
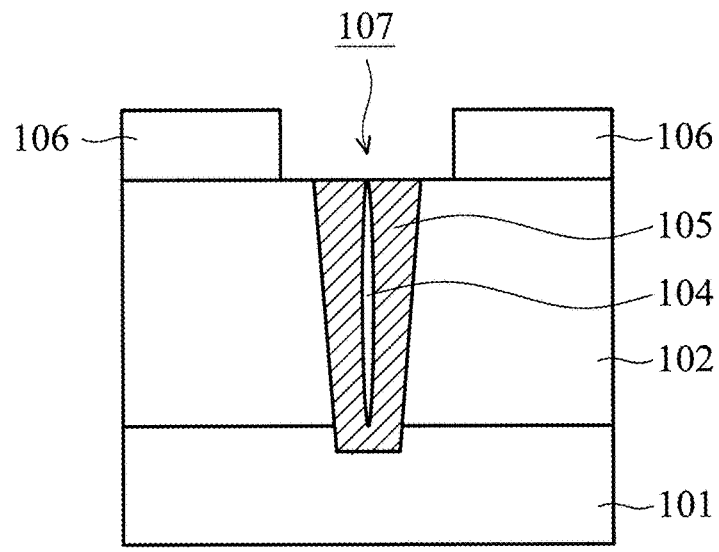

To solve the problems mentioned above, in some embodiments, as shown in FIGS. 1F-1I, a second dielectric layer 106 and a conductive layer 108 are formed over the first dielectric layer 102 and the via 105 to avoid the bottom electrode of the capacitor structure being in contact with the seam 104. As shown in FIG. 1F, the second dielectric layer 106 is deposited over the first dielectric layer 102 and the via 105. The material of the second dielectric layer 106 may be the same as the material of the first dielectric layer 102. In some embodiments, the second dielectric layer 106 may be formed by chemical vapor deposition (CVD) process. In some embodiments, as shown in FIG. 1G, a second opening 107 is formed in the second dielectric layer 106 over the first opening 103 after the second dielectric layer 106 is deposited. The second opening 107 may be formed by preforming an etching process on the second dielectric layer 106. The etching processes include dry etching, wet etching, or other etching methods. The etching process is also either chemical etching, physical etching, or a combination thereof.

Figure 1H:
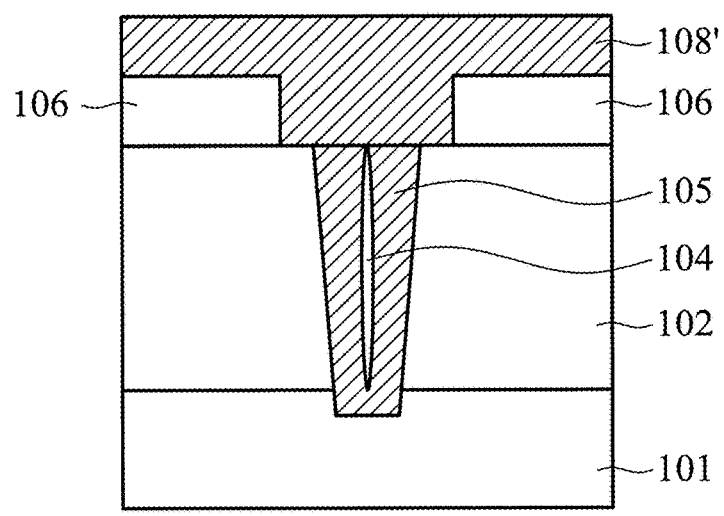

As shown in FIG. 1H, the conductive material layer 108' is deposited in the second opening 107 and over the second dielectric layer 106 after the second opening 107 is formed. The conductive material layer 108' includes metal, for example, tungsten, copper, or another applicable conductive material. The conductive material layer 108' may be formed by chemical vapor deposition (CVD), physical vapor deposition (PVD) or another applicable process. To remove excess material of the conductive material layer 108' beyond the second opening 107, a grinding or a chemical mechanical polishing (CMP) process may be utilized whereby etchants and abrasives are utilized in order to remove the excess material of the conductive material layer 108', and the conductive material layer 108' remaining within the second opening 107 forms a conductive layer 108.

Figure 1I:
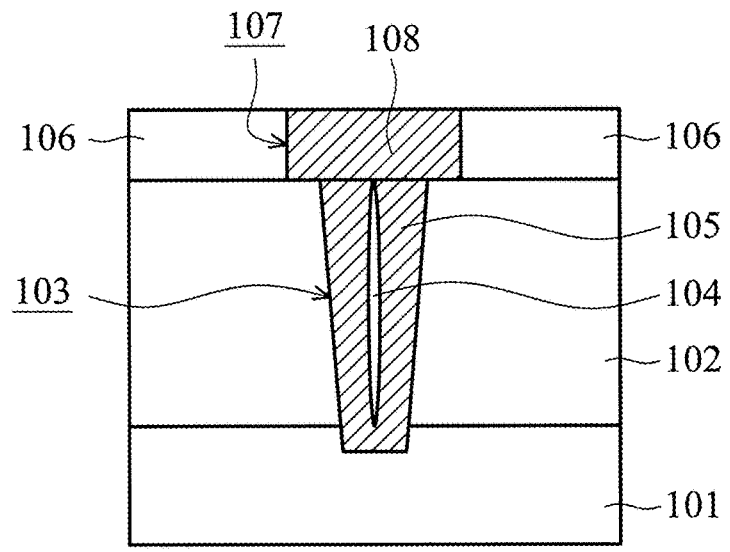

In some embodiments, as shown in FIG. 1I, the aspect ratio of the second opening 107 is smaller than the aspect ratio of the first opening 103, and the surface area of the second opening 107 is larger than the surface area of the first opening 103. Since the second opening 107 has a smaller aspect ratio such as 1.5-2, it can be avoided from generating the seam during the deposition of the conductive material layer 108' in the second opening 107. Namely, the subsequently formed conductive layer 108 doesn't have a seam therein, and there is no seam exposed by the top flat surface of the conductive layer 108 performed by chemical mechanical polishing (CMP).

Figure 1J:
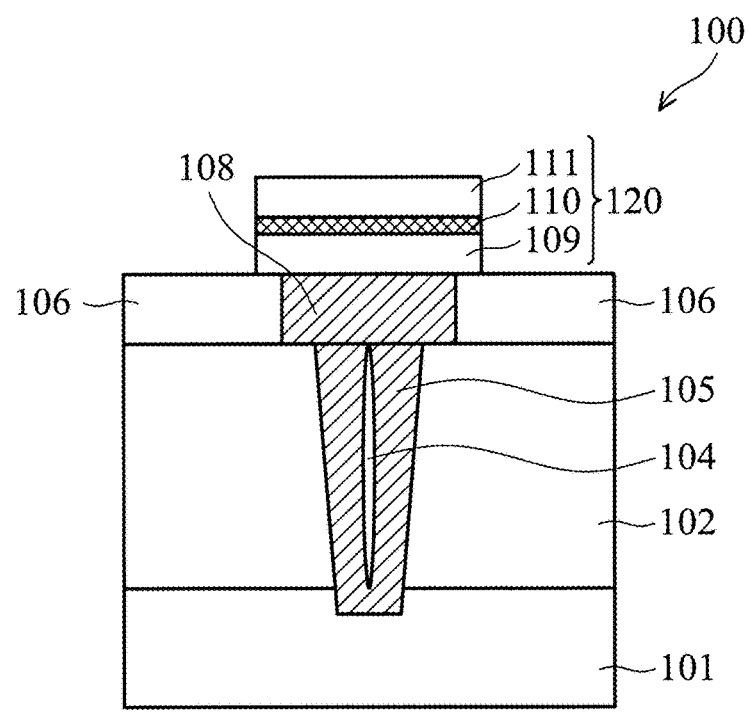

As shown in FIG. 1J, a capacitor structure 120 is formed over the second dielectric layer 106 and the conductive layer 108 after the conductive layer 108 is formed. The capacitor structure 120 includes a bottom electrode 109, a variable resistance layer 110 disposed over the bottom electrode 109 and a top electrode 111 disposed over the variable resistance layer 110.

The bottom electrode 109 is disposed over the conductive layer 108, the material of the bottom electrode 109 may include gold (Au), platinum (Pt), ruthenium (Ru), iridium (Ir), Titanium (Ti), aluminum (Al), copper (Cu), tantalum (Ta), tungsten (W), oxide, nitride, fluoride, carbide, silicide, TaN, TiN, TiAlN, TiW, another applicable material such as an alloy, or a combination thereof. In some embodiments, the thickness of the bottom electrode 109 is in a range between 10 nm and 200 nm. In some embodiment, the bottom electrode 109 may include multiple layers, for example, the bottom electrode 109 includes a tungsten layer and a titanium nitride (TiN) layer. In some embodiments, the bottom electrode 109 may be formed by a physical vapor deposition (PVD) process.

The variable resistance layer 110 is disposed over the bottom electrode 109 and is in direct contact with the bottom electrode 109. The material of the variable resistance layer 110 is selected from a group consisting of a metal oxide compound, wherein the metal of the metal oxide compound may include tungsten (W), tantalum (Ta), Titanium (Ti), nickel (Ni), cobalt (Co), hafnium (Hf), ruthenium (Ru), zinc (Zn), iron (Fe), tin (Sn), aluminum (Al), copper (Cu), silver (Ag), chromium (Cr) or molybdenum (Mo). In some embodiments, hafnium oxide is used for forming the variable resistance layer 110. In some embodiments, the thickness of the variable resistance layer 110 is in a range between 1 nm and 100 nm. In some embodiments, the variable resistance layer 110 may be formed by chemical vapor deposition (CVD), physical vapor deposition (PVD) or atomic layer deposition (ALD).

The top electrode 111 is formed on the variable resistance layer 110. The material of the top electrode 111 includes gold (Au), platinum (Pt), ruthenium (Ru), iridium (Ir), Titanium (Ti), aluminum (Al), copper (Cu), tantalum (Ta), tungsten (W), oxide, nitride, fluoride, carbide, silicide, TaN, TiN, TiAlN, TiW, another applicable material such as an alloy, or a combination thereof. In some embodiments, the thickness of the top electrode 111 is in a range between 10 nm and 200 nm. In some embodiments, the top electrode 111 may be formed by a physical vapor deposition (PVD) process.

As shown in FIG. 1J, the resistive memory cell 100 is completed after the capacitor structure 120 is formed. In this embodiment, the surface of the conductive layer 108 in contact with the bottom electrode 109 doesn't have a seam and is the flat surface performed by a chemical mechanical polishing (CMP) process. Therefore, the risk of leakage in the memory device is reduced, which improves the production yield and reduces the cost.

Figure 2A:
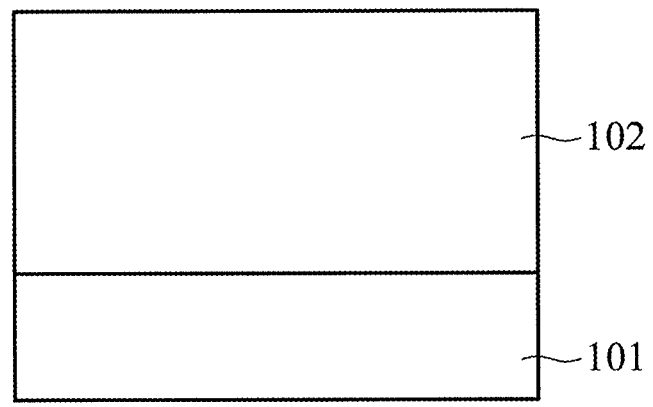
FIGS. 2A to 2F are cross-sectional representations of various stages of forming a resistive memory cell of a memory device in accordance with some embodiments.
Figure 2B:
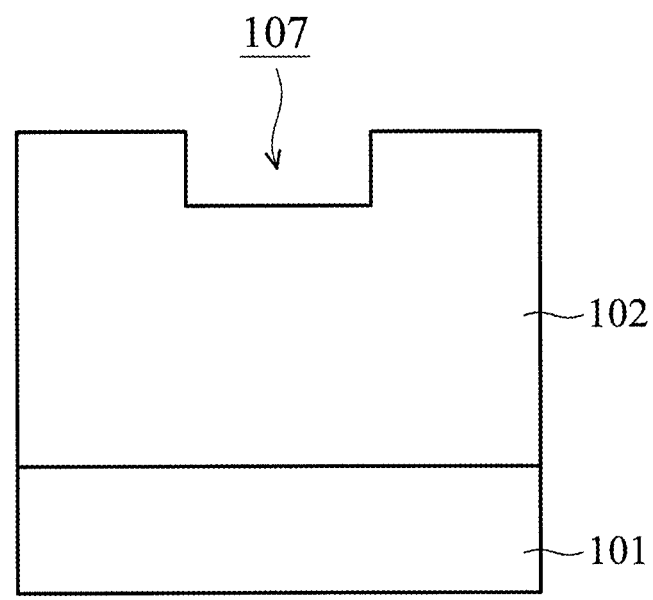
Figure 2C:
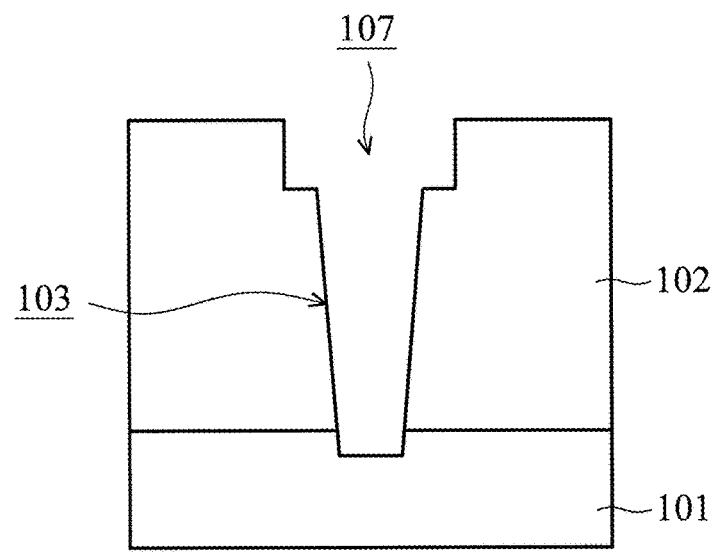

FIGS. 2A to 2F are cross-sectional representations of various stages of forming a resistive memory cell 100 in accordance with some embodiments. In some embodiments, a dual damascene process may be used to form the first opening 103, the second opening 107, the via 105 and the conductive layer 108 in the dielectric layer. As shown in FIGS. 2A-2B, anisotropic etching process may be performed on the first dielectric layer 102 to form the second opening 107. As shown in FIG. 2C, after the second opening 107 is formed, the etching process performed on the first dielectric layer 102 to form the first opening 103 is continued, wherein the aspect ratio of the second opening 107 is smaller than the aspect ratio of the first opening 103.

Figure 2D:
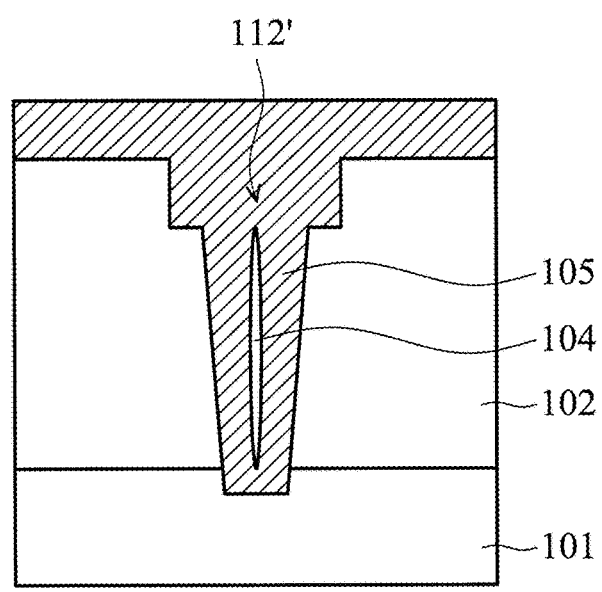
Figure 2E:
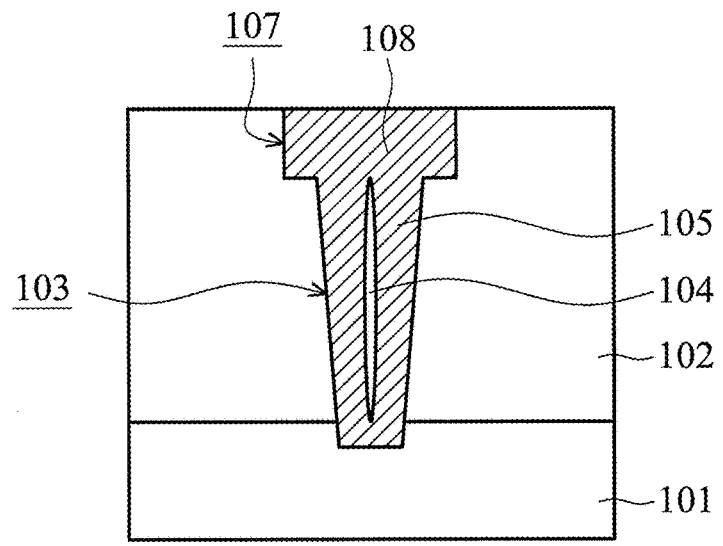

As shown in FIG. 2D, after the first opening 103 and the second opening 107 are formed, a conductive material layer 112' fills into the first opening 103 and the second opening 107 to cover the first dielectric layer 102. Next, to remove excess material of the conductive material layer 112' beyond the second opening 107, a grinding or chemical mechanical polishing (CMP) process may be utilized whereby etchants and abrasives are utilized in order to remove the excess material of the conductive material layer 112'. As shown in FIG. 2E, the conductive material layer 112' remaining within the second opening 107 forms the conductive layer 108, and the conductive material layer 112' remaining within the first opening 103 forms the via 105.

Due to the smaller aspect ratio of the second opening 107, the seam 104 may be formed only in the first opening 103 which has a larger aspect ratio during the process of depositing the conductive material layer 112'. The seam 104 is not formed in the second opening 107 which has a smaller aspect ratio. Namely, there is no seam exposed by the top flat surface of the conductive layer 108 performed by a chemical mechanical polishing (CMP) process.

Figure 2F:
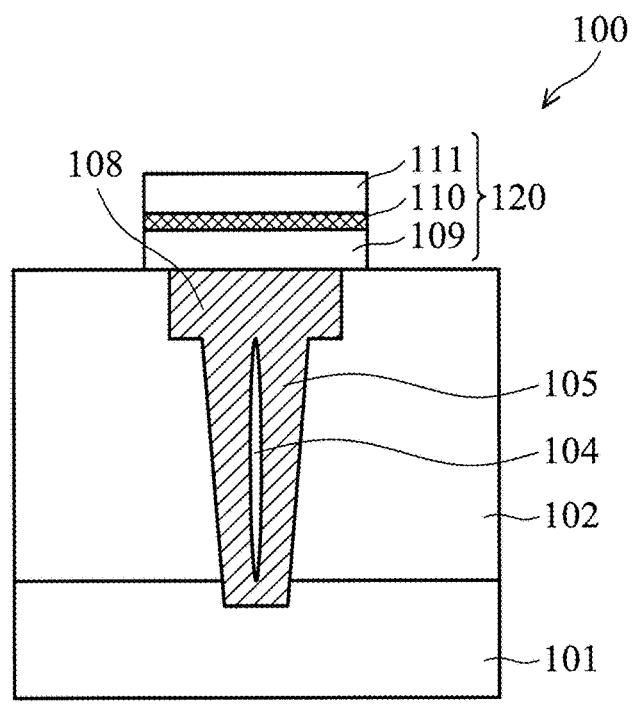

Next, as shown in FIG. 2F, the resistive memory cell 100 of the memory device is completed after the capacitor structure 120 is formed on the conductive layer 108. In this embodiment, due to the dual damascene process, only one step is needed to deposit the dielectric layer and the conductive material layer, and the via 105 and the seamless conductive layer 108 are formed simultaneously. Thus the number of steps in the process of manufacturing the resistive memory cell 100 are reduced, and the cost is also reduced.

Figure 3A:
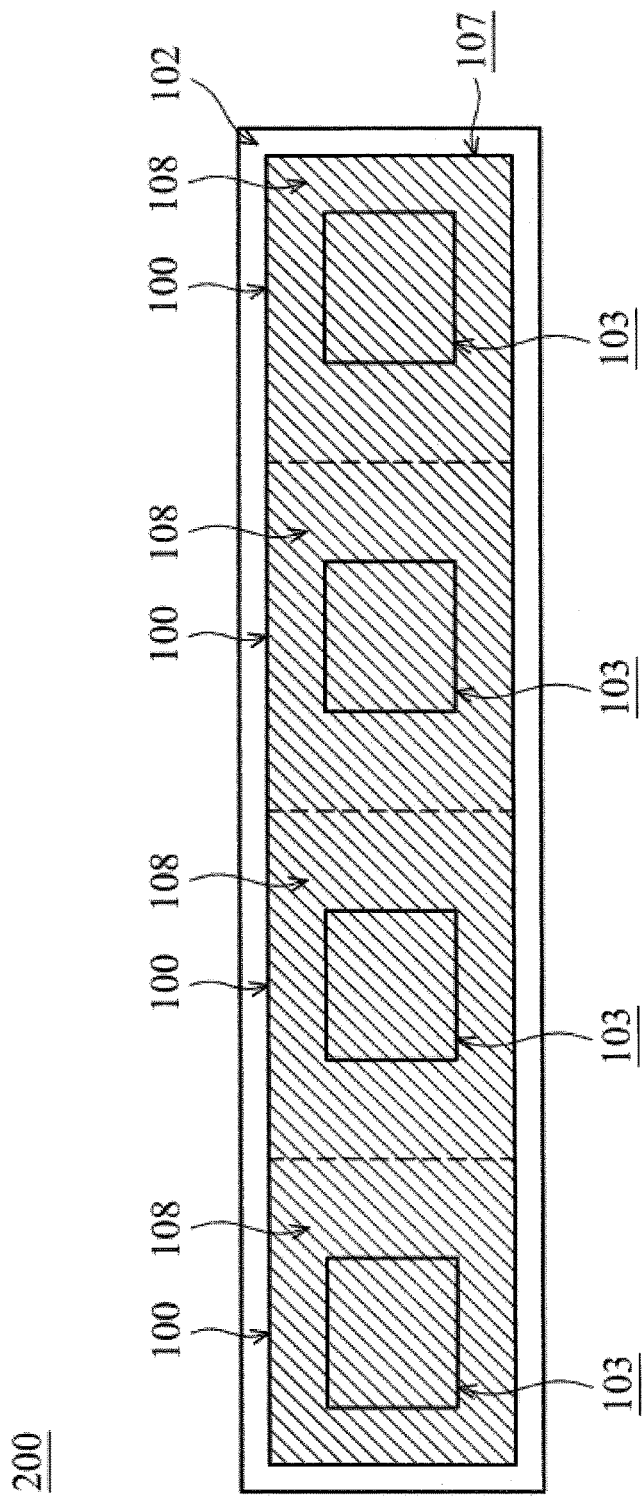
FIGS. 3A to 3B are top views of the layout of resistive memory cells of a memory device in accordance with some embodiments.
Figure 3B:
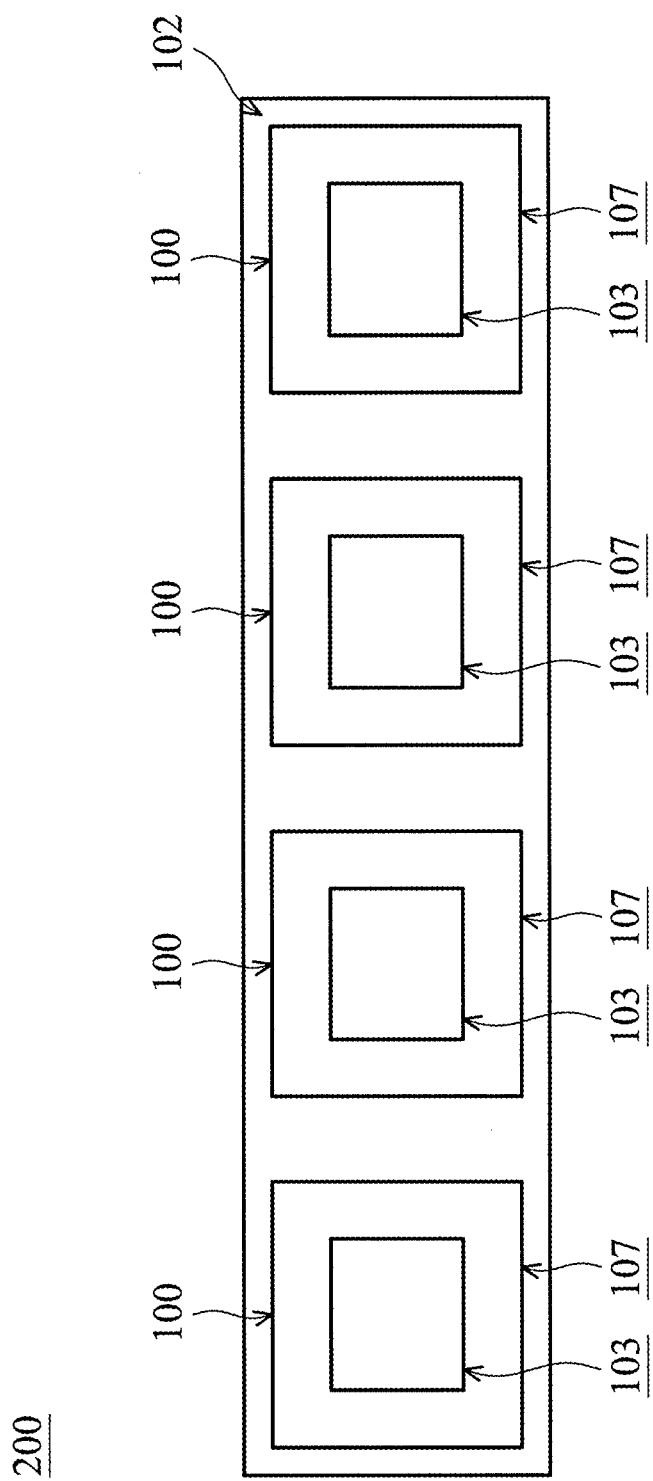

FIGS. 3A-3B are top views of the layout of a plurality of resistive memory cells 100 of a memory device 200 in accordance with some embodiments. In order to clearly describe the layout of the first opening 103 and the second opening 107 in the resistive memory cell 100, some elements are omitted. As shown in FIG. 3A, the memory device 200 includes a plurality of resistive memory cells 100, in this embodiment, the conductive layers 108 of the plurality of resistive memory cells 100 are connected to each other, and the second opening 107 is a trench corresponding to a plurality of the first openings 103 under the conductive layers 108 which are connected to each other.

As shown in FIG. 3B, in some embodiments, every second opening 107 corresponds to one respective first opening 103, the conductive layers 108 of every resistive memory cell 100 are separated from each other by an insulating layer (e.g. the first dielectric layer 102). The layout of the memory device 200 may be changed according to the arrangement of the conductive layer 108, and thus the layout of the memory device 200 becomes more flexible.

Figure 4A:
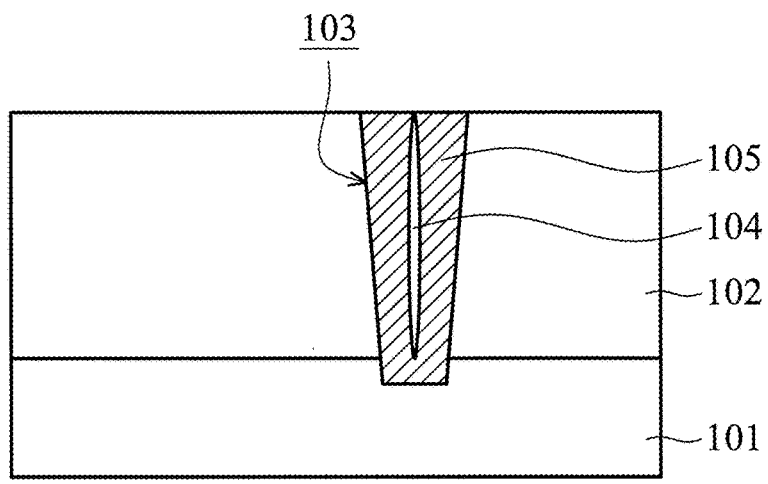
FIGS. 4A to 4D are cross-sectional representations of various stages of forming a resistive memory cell of a memory device in accordance with some embodiments.
Figure 4B:
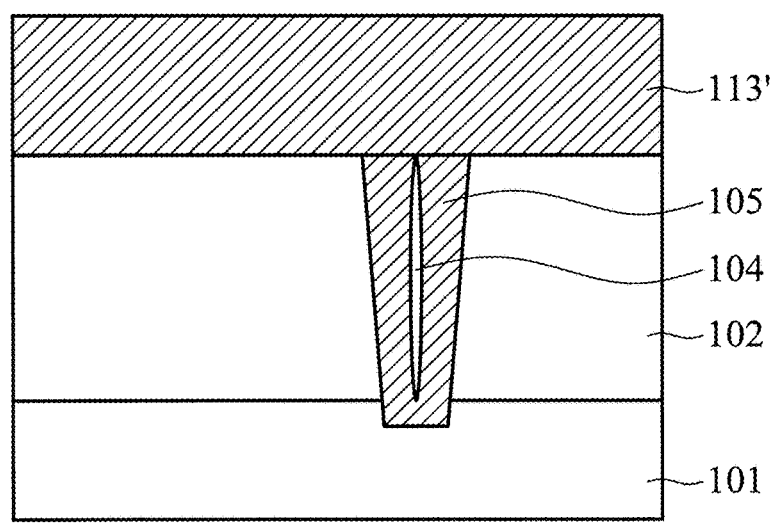
Figure 4C:
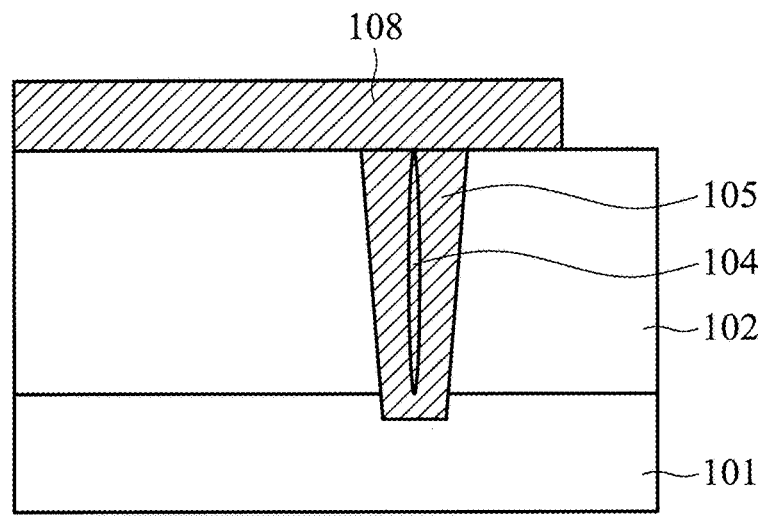

FIGS. 4A to 4D are cross-sectional representations of various stages of forming a resistive memory cell 100 of a memory device in accordance with some embodiments. In some embodiments, as shown in FIG. 4A, at first, the first dielectric layer 102 is deposited on the semiconductor substrate 101, and the first opening 103 is formed in the first dielectric layer 102. After the via 105 is formed in the first opening 103, as shown in FIG. 4B, the conductive material layer 113' is deposited over the first dielectric layer 102 and the via 105. As shown in FIG. 4C, the conductive layer 108 is formed after a chemical mechanical polishing (CMP) process is performed on the conductive material layer 113'. In this embodiment, only the conductive material layer 113' is polished during the chemical mechanical polishing (CMP) process, and thus it can avoid having two or more materials polished simultaneously. For example, during the step as shown in FIGS. 1D-1E, the chemical mechanical polishing (CMP) process is performed on the conductive material layer 105' until the top surface of the first dielectric layer 102 and the top surface of the conductive material layer 105' are coplanar, and both materials of the conductive material layer 105' and the first dielectric layer 102 are polished by the chemical mechanical polishing (CMP) process at the same time. Due to chemical mechanical polishing (CMP) process having different selectivity for different materials, the roughness of the polished surface will be worse if two or more materials are polished simultaneously. As shown in the steps of FIGS. 4B-4C, two or more materials are not polished during the chemical mechanical polishing (CMP) process on the conductive material layer 113', and thus the surface of the conductive layer 108 has less roughness so that the bottom electrode of the subsequently formed capacitor structure can be in contact with the flat surface of the conductive layer 108.

Figure 4D:
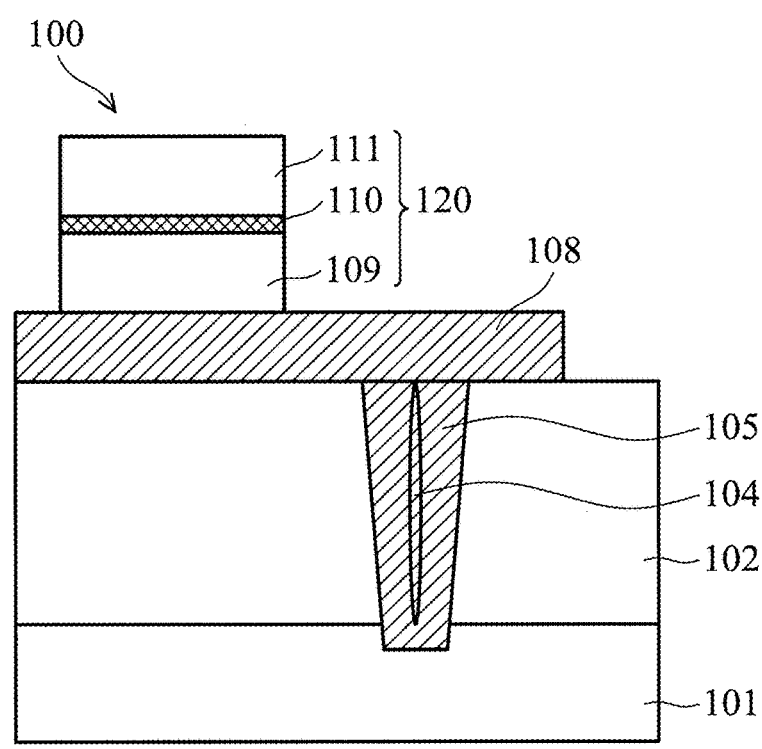

As shown in FIG. 4D, in some embodiments, after the conductive layer 108 is formed with a flat surface, a patterned process (e.g. an etching process) is performed on the conductive layer 108. Next, the resistive memory cell 100 is completed after the capacitor structure 120 is formed on the conductive layer 108. In this embodiment, because the bottom electrode 109 of the capacitor structure 120 is in contact with the flat surface of the conductive layer 108, the risk of leakage in the memory device is greatly reduced. Furthermore, the materials of the via 105 and the conductive layer 108 may be different, the applicable materials of the via 105 and the conductive layer 108 can be selected according to actual need. In some embodiments, the material of the conductive layer 108 can be selected from among tungsten (W), titanium nitride, tantalum nitride, copper (Cu), platinum (Pt), zirconium (Zr), tantalum (Ta), iridium (Ir), and combinations thereof. The material of the via 105 can be selected from among tungsten (W), titanium nitride, tantalum nitride, copper (Cu), platinum (Pt), zirconium (Zr), tantalum (Ta), iridium (Ir), and combinations thereof.

Figure 5A:
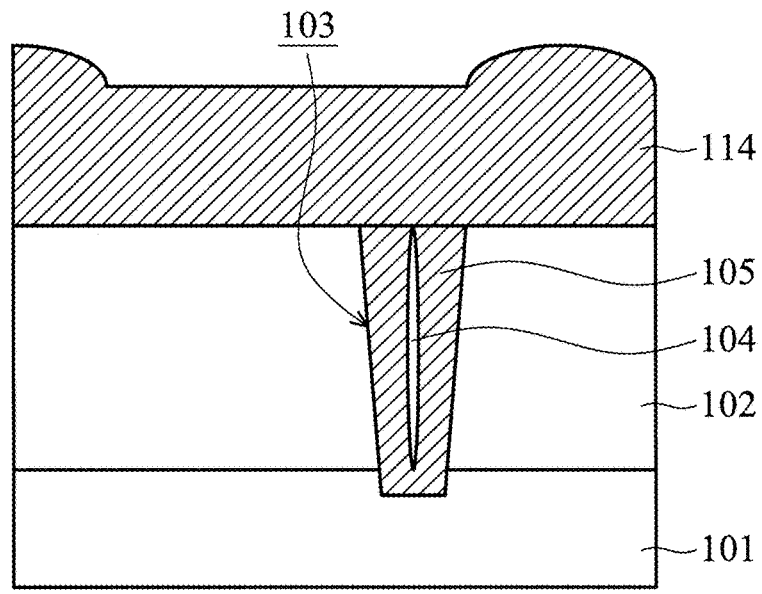
FIGS. 5A to 5C are cross-sectional representations of various stages of forming a resistive memory cell of a memory device in accordance with some embodiments.
Figure 5B:
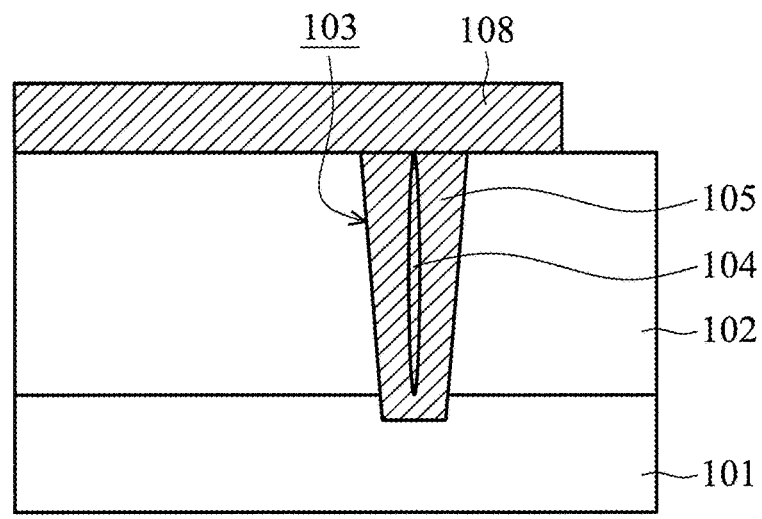
Figure 5C:
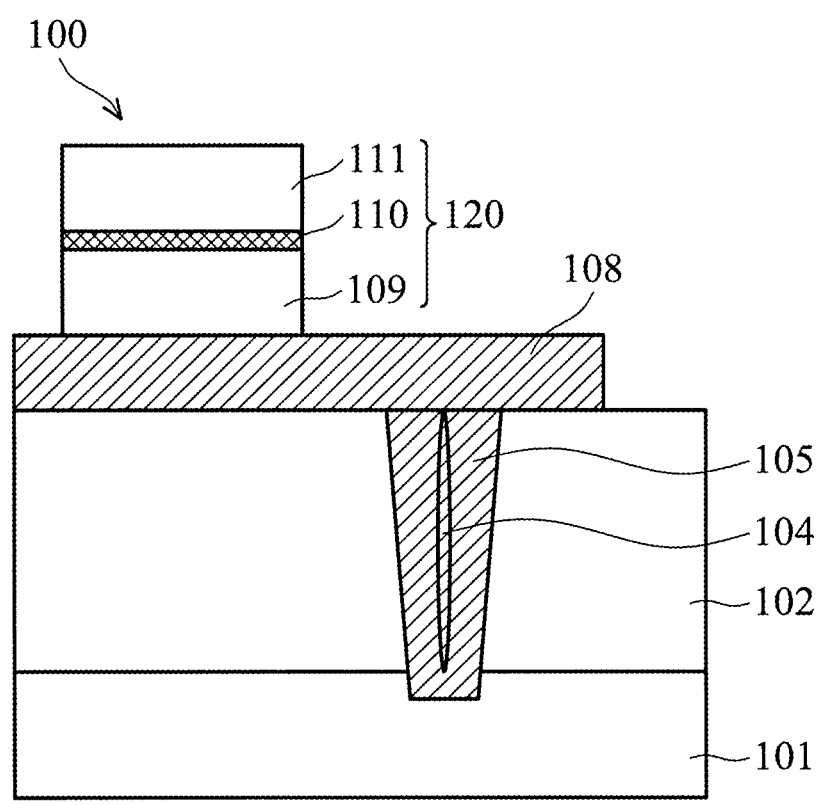

FIGS. 5A to 5C are cross-sectional representations of various stages of forming a resistive memory cell 100 of a memory device in accordance with some embodiments. The difference between FIGS. 5A to 5C and FIGS. 4A to 4D is that the deposition process of the via 105 and the conductive layer 108 can be performed in the same step. In this time, the materials of the via 105 and the material of the conductive layer 108 are the same. As shown in FIGS. 5A to 5B, after a conductive material layer 114' is deposited in the first opening 103 and over the first dielectric layer 102, a chemical mechanical polishing (CMP) process is performed on the conductive material layer 114', and a portion of the conductive material layer 114' over the via 105 and the first dielectric layer 102 remains to form the conductive layer 108. In this embodiment, two or more materials are not polished during the chemical mechanical polishing (CMP) process, and thus the conductive layer 108 has better roughness. In addition, a patterning process may also be performed on the conductive layer 108 to separate the conductive layer 108 of different resistive memory cells 100. Patterned processes include lithography, etching, and other applicable processes.

Finally, as shown in FIG. 5C, after the conductive layer 108 is formed with a flat surface and the capacitor structure 120 is formed on the conductive layer 108, the resistive memory cell 100 of the memory device is completed. In this embodiment, because the bottom electrode 109 of the capacitor structure 120 is in contact with the flat surface of the conductive layer 108, the risk of leakage in the memory device is greatly reduced.

In addition, in some embodiments, as shown in FIG. 4D or 5C, the capacitor structure 120 doesn't overlap with the via 105. In this embodiment, because the capacitor structure 120 is far away from the via 105 which has a seam 104, the risk of leakage in the memory device is reduced.

Figure 6A:
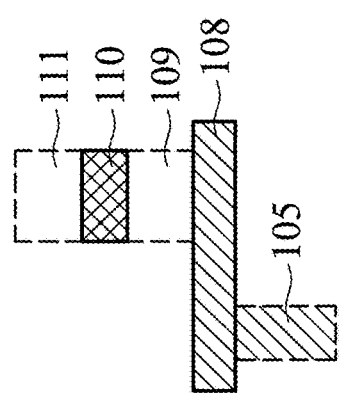
FIGS. 6A to 6C are cross-sectional representations of relative positions of a via and a capacity structures of a resistive memory cell of a memory device in accordance with some embodiments.
Figure 6B:
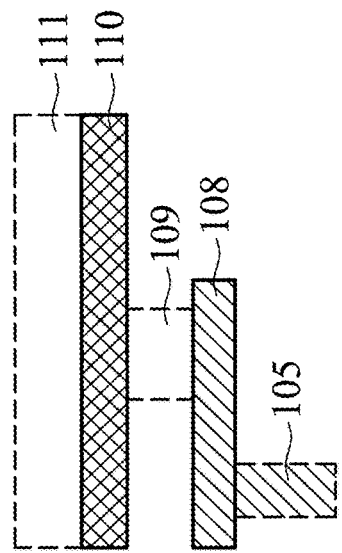
Figure 6C:
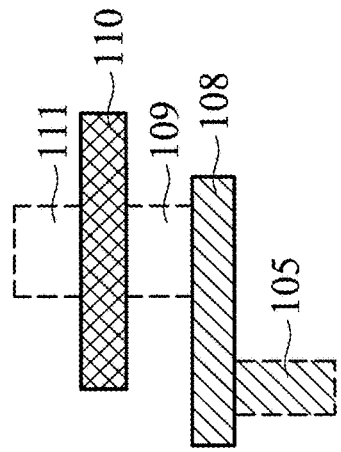

FIGS. 6A to 6C are cross-sectional representations of the relative positions of the via 105, the conductive layer 108, and the capacitor structure 120 of the resistive memory cell 100 of the memory device 200 in accordance with some embodiments. In order to clearly describe the arrangement of the via 105 and the capacitor structure 120 of the resistive memory cell 100, as shown in FIGS. 6A to 6C, some elements are omitted. In some embodiments, as shown in FIG. 6A, the bottom electrode 109, the variable resistance layer 110 and the top electrode 111 of the capacitor structure 120 don't all overlap with the via 105. In some embodiments, as shown in FIG. 6B, the variable resistance layer 110 and the top electrode 111 of the capacitor structure 120 may extend to above the via 105 and overlap with the via 105. The bottom electrode 109 doesn't extend to above the via 105 and doesn't overlap with the via 105. In some embodiments, as shown in FIG. 6C, the variable resistance layer 110 of the capacitor structure 120 may extend to above the via 105 and overlap with the via 105. The bottom electrode 109 and the top electrode 111 don't extend to above the via 105 and also don't overlap with the via 105. In these embodiments, since the bottom electrode 109 is far away from the via 105 which has a seam 104, and since the bottom electrode 109 is in contact with the flat polished surface of the conductive layer 108, the risk of leakage in the memory device is reduced.

Figure 7A:
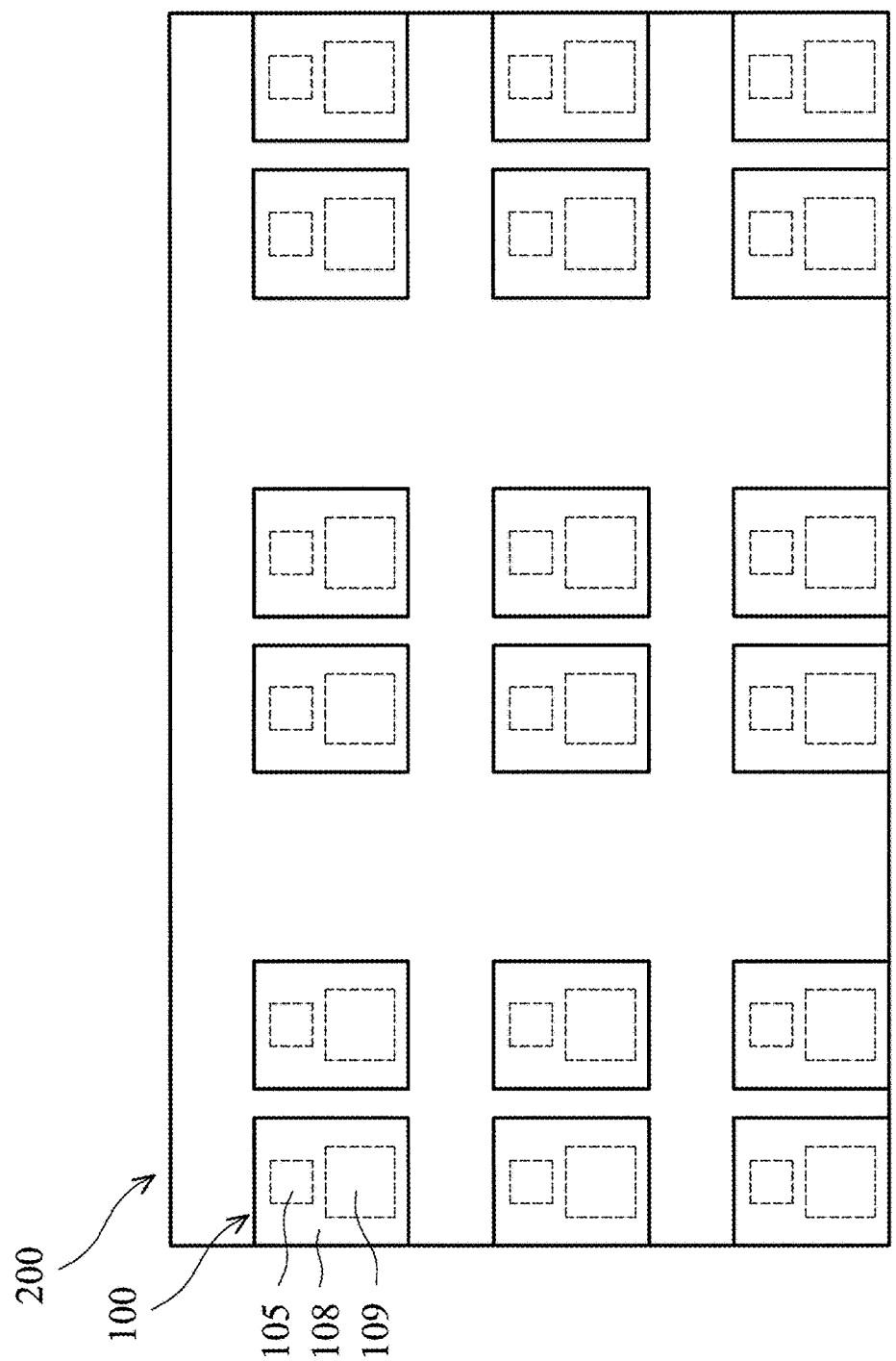
FIGS. 7A to 7B are top views of the layout of resistive memory cells of a memory device in accordance with some embodiments.
Figure 7B:
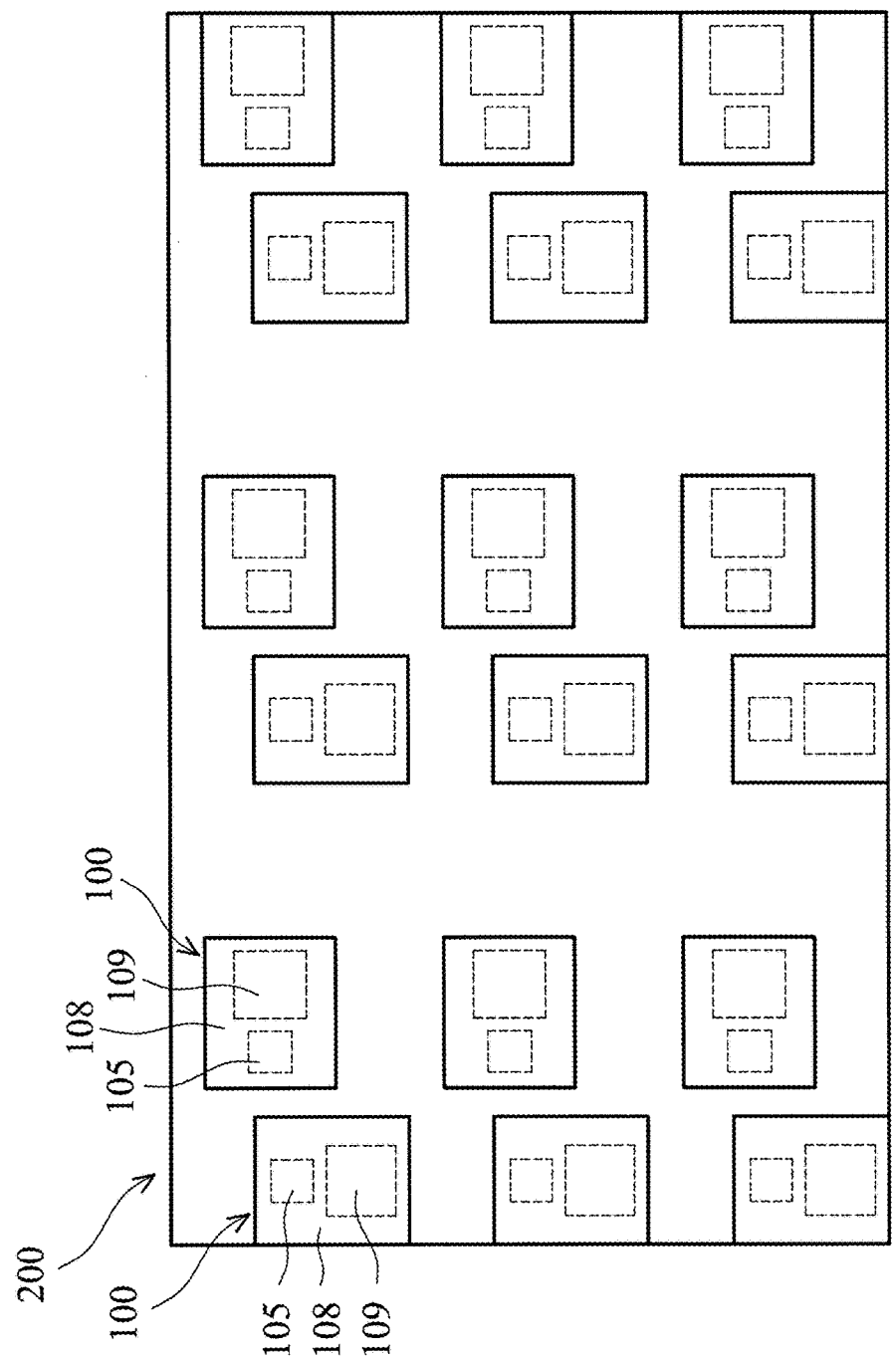

FIGS. 7A-7B are top views of the layout of the resistive memory cells 100 of the memory device 200 in accordance with some embodiments. In order to clearly describe the layout of the capacitor structures 120, the conductive layers 108, and the vias 105 of the resistive memory cells 100, as shown in FIGS. 7A to 7B, some elements are omitted. In some embodiments, as shown in FIG. 7A, the memory device 200 includes a plurality of resistive memory cells 100. Every via 105 of these resistive memory cells 100 are aligned to each other, and every conductive layer 108 of these resistive memory cells 100 are aligned to each other, and furthermore every capacitor structure 120 of these resistive memory cells 100 are aligned to each other. In some embodiments, as shown in FIG. 7B, every via 105 of these memory cells 100 is aligned to each other, but two adjacent conductive layers 108 in the different columns of these resistive memory cells 100 are not aligned to each other, and two adjacent capacitor structures 120 in the different columns of these resistive memory cells 100 are not aligned to each other. The change of the layout of the conductive layers 108 provides more layout flexibility for the memory device 200.

As mentioned above, the present disclosure provides a conductive layer which has a flat surface and doesn't have a seam exposed thereon. This conductive layer (which can also be called a redistribution layer) is used for being electrically connected to the via of the memory cell and the bottom electrode of the capacitor structure, and thus the risk of leakage in the memory device is reduced. It also improves the layout flexibility of the memory device, and thus the yield is improved and the cost is reduced.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A memory device, comprising:
   a substrate;
   a dielectric layer disposed on the substrate; and
   a plurality of resistive memory cells disposed on the dielectric layer, wherein each of the resistive memory cells comprises:
   a via disposed in a first opening of the dielectric layer, wherein the first opening passes through the dielectric layer and extends into the substrate;
   a conductive layer disposed on the via; and
   a capacitor structure comprising a bottom electrode, a variable resistance layer disposed on the bottom electrode and a top electrode disposed on the variable resistance layer, wherein the bottom electrode is disposed on the conductive layer.

2. The memory device as claimed in claim 1, wherein the material of the via and the material of the conductive layer are different.

3. The memory device as claimed in claim 1, wherein the material of the via and the material of the conductive layer are the same.

4. The memory device as claimed in claim 1, wherein the dielectric layer further comprises a second opening disposed on the first opening, and the conductive layer is in the second opening, and an aspect ratio of the second opening is smaller than that of the first opening.

5. The memory device as claimed in claim 4, wherein an upper surface area of the second opening is larger an upper surface area of the first opening.

6. The memory device as claimed in claim 4, wherein the conductive layers of the plurality resistive memory cells are connected to each other, and the second opening is a trench corresponding to the first openings under the conductive layers which are connected to each other.

7. The memory device as claimed in claim 4, wherein the conductive layers of the plurality of resistive memory cells are separated from each other, and the second opening corresponds to one of the first openings.

8. The memory device as claimed in claim 1, wherein the bottom electrode does not overlap with the via.

9. The memory device as claimed in claim 8, wherein the variable resistance layer and the top electrode overlap with the via.

10. The memory device as claimed in claim 8, wherein the variable resistance layer overlaps with the via, and the top electrode does not overlap with the via.

11. The memory device as claimed in claim 1, wherein the vias of the plurality of resistive memory cells are aligned to each other, and the capacitor structures of the plurality of resistive memory cells are aligned to each other.

12. The memory device as claimed in claim 1, wherein the vias of the plurality of resistive memory cells are aligned to each other, and the capacitor structures of the plurality of resistive memory cells are not aligned to each other.

13. The memory device as claimed in claim 1, wherein the material of the conductive layer comprises tungsten, titanium nitride, tantalum nitride or a combination thereof, and the material of the via comprises tungsten, titanium nitride, tantalum nitride or a combination thereof.

14. A method for forming a memory device, comprising:
providing a substrate;
forming a first dielectric layer on the substrate;
forming a first opening in the first dielectric layer, wherein the first opening passes through the first dielectric layer and extends into the substrate;
forming a via in the first opening;
forming a second dielectric layer on the first dielectric layer;
forming a second opening in the second dielectric layer, and filling a conductive layer in the second opening, wherein the aspect ratio of the second opening is smaller than an aspect ratio of the first opening;
performing a planarization process on the conductive layer; and
forming a capacitor structure on the conductive layer, wherein a bottom electrode of the capacitor structure is in contact with a planarized surface of the conductive layer.

15. The method as claimed in claim 14, wherein the via and the conductive layer are deposited in the same step.

16. The method as claimed in claim 14, wherein the via and the conductive layer are deposited in different steps.

17. A method for forming a memory device, comprising:
providing a substrate;
forming a dielectric layer on the substrate;
forming a via in the dielectric layer, wherein the via passes through the dielectric layer and extends into the substrate;
forming a conductive layer on the via and the dielectric layer; and
forming a capacitor structure on the conductive layer, wherein the capacitor structure comprises a bottom electrode formed on the conductive layer, a variable resistance layer formed on the bottom electrode and a top electrode formed on the variable resistance layer.

18. The method as claimed in claim 17, further comprising:
performing a chemical-mechanical planarization process and a patterning process on the conductive layer, wherein the bottom electrode of the capacitor structure is in contact with a planarized surface of the conductive layer.

19. The method as claimed in claim 17, wherein the via and the conductive layer are deposited in the same step.

20. The method as claimed in claim 17, wherein the via and the conductive layer are deposited in different steps, and the material of the via and the material of the conductive layer are different.

* * * * *